US006885958B2

(12) United States Patent
Yaklin

(10) Patent No.: US 6,885,958 B2
(45) Date of Patent: Apr. 26, 2005

(54) SELF CALIBRATING CURRENT REFERENCE

(75) Inventor: Daniel A. Yaklin, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 159 days.

(21) Appl. No.: 10/226,324

(22) Filed: Aug. 22, 2002

(65) Prior Publication Data

US 2003/0038617 A1 Feb. 27, 2003

Related U.S. Application Data

(60) Provisional application No. 60/315,153, filed on Aug. 27, 2001.

(51) Int. Cl.[7] .......................... G01R 35/00; G05F 3/16

(52) U.S. Cl. .......................... 702/107; 702/64; 324/601

(58) Field of Search .......................... 702/57, 64, 65, 702/85, 87, 88, 116, 107, 119; 324/601; 323/313–316

(56) References Cited

U.S. PATENT DOCUMENTS

| | | | | |
|---|---|---|---|---|
| 5,124,632 A | * | 6/1992 | Greaves | 323/316 |
| 5,477,504 A | * | 12/1995 | Hagerty | 367/13 |
| 5,739,682 A | * | 4/1998 | Kay | 323/315 |
| 5,754,038 A | * | 5/1998 | Durec et al. | 323/313 |
| 6,160,851 A | * | 12/2000 | Brown et al. | 375/254 |
| 6,185,130 B1 | * | 2/2001 | Hollmer et al. | 365/185.2 |
| 6,243,382 B1 | | 6/2001 | O'Neill et al. | |
| 6,253,265 B1 | | 6/2001 | Schwan | |
| 6,275,090 B1 | * | 8/2001 | Burger, Jr. et al. | 327/334 |
| 6,448,811 B1 | * | 9/2002 | Narendra et al. | 326/82 |
| 2002/0196595 A1 | * | 12/2002 | Ciancio | 361/93.1 |

OTHER PUBLICATIONS

Hoffman, Gary, et al., "IEEE 1394: A Ubiquitous Bus," COMPCON '95, San Francisco, California, Mar. 5–9, 1995, 11 pages.

Bartholdy, Felix, "Performance Analysis of an IEEE 1394 Network," Texas Instruments, Application Report SLLA099, Apr. 2001, 15 pages.

Renaud, Daniel, "ADS Pryo Digital Video 1394DV Firewire Card," Hardward Central™, printed from the Internet at http://www.hardwarecentral.com/hardwarecentral/reviews/982/1/, 4 pages.

"Philips Semiconductors—IEEE 1394 Multimedia Bus; Backgrounder," printed from the Internet at http://www.semiconductors.philips.com/1394/background/, 5 pages.

* cited by examiner

*Primary Examiner*—Marc S. Hoff
*Assistant Examiner*—Manuel L. Barbee
(74) *Attorney, Agent, or Firm*—J. Dennis Moore; W. James Brady, III; Frederick J. Telecky, Jr.

(57) ABSTRACT

The present invention relates to a current reference system comprising a selectively activatable high current reference circuit operable to generate a reference calibration circuit when activated and a low current calibrated reference current circuit operable to generate a reference current having a value based upon a control data. The system further comprises a control circuit operable to activate the selectively activatable high current reference circuit during a calibration period. The control circuit is further operable to vary a characteristic of the low current calibrated reference current circuit in a predetermined fashion while comparing another characteristic of the low current calibrated reference current circuit to a predetermined value. The control circuit then identifies a calibration condition based on the comparison, and generates the control data associated therewith.

17 Claims, 4 Drawing Sheets

SELF CALIBRATING CURRENT REFERENCE

This application claims priority under 35 USC § 119(e)(1) of provisional application Ser. No. 60/315,153, filed Aug. 27, 2001.

FIELD OF THE INVENTION

The present invention relates generally to the field of integrated circuits, and more particularly to a system and method of providing

BACKGROUND OF THE INVENTION

Myriad integrated circuit applications utilize current references. In a subset of such applications, such a current reference circuit must be precise and draw a minimal amount of chip supply current, particularly in applications which employ battery power. One exemplary application involves a physical layer device in an IEEE 1394 compliant chipset.

The IEEE 1394 is a high-speed serial bus standard that enables interconnecting of multiple digital devices in a universal fashion. The architecture for the IEEE 1394 bus standard is scalable and employs a flexible peer-to-peer topology that make the serial bus standard advantageous for connecting various types of devices such as computers to digital audio and video hardware.

The IEEE 1394 standard provides three protocol layers as illustrated in FIG. 1, and designated at reference numeral 10. The three layers include a physical layer 12, a link layer 14, and a transaction layer 16; a serial bus management process 18 then connects to each of the three layers. The physical layer 12 connects to a serial bus connector 20 while the other layers 14 and 16 connect to the application (not shown). The physical layer 12 provides the electrical and mechanical connection between the 1394 compliant device and the 1394 cable. In addition to the actual data transmission and reception tasks, the physical layer 12 provides arbitration to insure that all devices have fair access to the bus (not shown).

The link layer 14 provides a data packet delivery service for two types of packet delivery: asynchronous and isochronous. Asynchronous packet delivery is directed to the conventional "transmit-acknowledge" protocol while isochronous packet delivery involves a real-time guaranteed bandwidth protocol for just-in-time delivery of information. The transaction layer 16 provides support for the asynchronous protocol for write, read and lock commands. For example, a write sends data from the originator to the receiver and a read returns the data to the originator, while a lock command combines the write and read functions by producing a round trip routing of data between the sender and the receiver, including any processing by the receiver.

Lastly, the serial bus management 18 provides configuration control of the serial bus (not shown) to: optimize arbitration timing, guarantee adequate power for devices on the bus, assign which 1394 device is the cycle master, assign an isochronous channel ID, and provide notification of errors.

In one particular exemplary application, the physical layer device 12 is in a low power state, but needs to monitor for a connection. In doing so, the physical layer device 12 is required to transmit periodic tone signals for the connection monitoring. Such tones are required to be transmitted with a precise drive current level to determine when a connection is made to another 1394-type device. In such a context, as well as others, there is a need for a high precision current source circuit which utilizes a minimal amount of power.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its primary purpose is to present some concepts of the invention in a simplified form as a prelude to the more detailed description that is presented later.

The present invention relates generally to a calibrating current source circuit. The current source circuit exhibits low power dissipation by using a relatively high current type reference current circuit to calibrate the current source during a calibration mode. Upon calibration, calibration control data associated therewith is stored in a memory device and is subsequently employed by the current source circuit to calibrate the current source in an operation mode. Since the relatively high current reference current circuit and calibration control circuitry is inactive during the operation mode, the calibrating current source circuit uses small amounts of power while providing a precise source current for various types of applications.

According to one aspect of the present invention, a current reference system comprises a selectively activatable current reference circuit operable to generate a reference current in a calibration mode. A calibrated current source circuit is operably coupled to the current reference circuit in a calibration mode, and is operable to generate a source current having a magnitude or value which is a function of calibration control data. A control circuit is operably coupled to the calibrated current source circuit in the calibration mode and is operable to vary the calibration control data, for example, in a predetermined manner to thereby alter the source current magnitude.

Concurrently, the reference current and the source current are compared via a calibration circuit portion of the calibrated current source circuit and a calibration control data state is identified at which a predetermined relationship between the reference current and the source current is established, for example, when their values are approximately equal. The identified calibration control data state is then stored in a memory for subsequent use by the calibrated current source circuit in an operation mode to generate a calibrated source current while dissipating a minimal amount of power.

According to another aspect of the present invention, the current reference circuit and the control circuit operate in a calibration mode and are turned off or are inactive otherwise, such as in an operation mode, and thus only experience leakage in such instances. Accordingly, the current reference system of the present invention is operable to generate a calibrated current source which dissipates a minimal amount of power, thereby making the system advantageous for applications in which low power dissipation is important, for example, in an IEEE 1394 compliant physical layer device within a system employing a battery.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The present invention is directed to a current source system that provides a relatively high precision, calibrated current while dissipating a minimal amount of power. The current source system has a relatively high current reference circuit which is activatable in a calibration mode and may be inactive otherwise. The high current reference circuit is operable to generate a regulated current during a calibration mode. A calibrated current source circuit is operably coupled to the high current reference circuit in the calibration mode and generates an output current therein. The output current is compared to the regulated current from the reference circuit and the comparison result is employed to modify the output current magnitude, thereby generating a calibrated output current.

A state of the calibrated current source circuit which generates the desired calibrated output current is then saved in memory for subsequent use each time a calibrated output current is needed in an operation mode. Accordingly, the relatively high current reference circuit need be employed only during a calibration mode of operation, thereby permitting substantially reduced current consumption (and thus power dissipation) during an operation mode, without negatively impacting an accuracy of the output current. A more thorough understanding of the invention will be obtained through the discussion of the present invention in conjunction with the drawings below.

Figure 1:
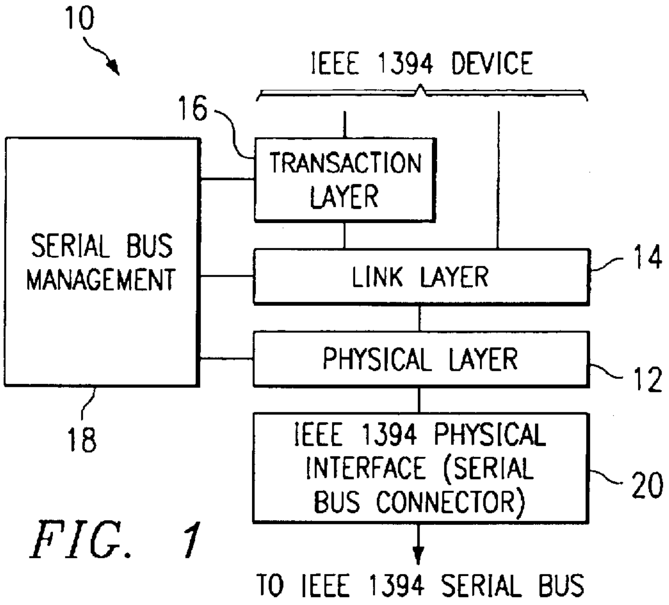
FIG. 1 is a block level schematic diagram illustrating an exemplary, conventional IEEE 1394 device architecture.
Figure 2:
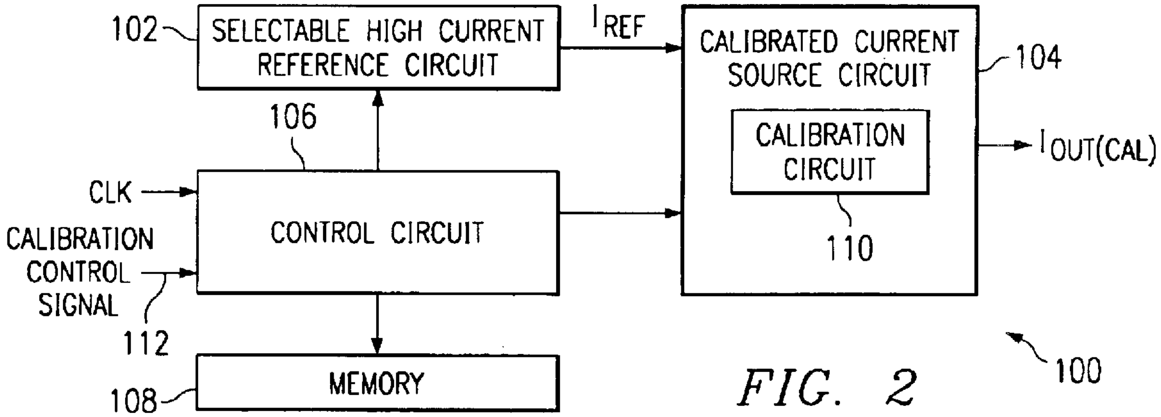
FIG. 2 is a block level schematic diagram illustrating a current reference system according to one exemplary aspect of the present invention.

Turning now to the figures, a current source system according to the present invention is illustrated in FIG. 2 and designated at reference numeral 100. The current source system 100 comprises a selectable high current reference circuit 102 which is operably coupled to a calibrated current source circuit 104. The selectable high current reference circuit 102 and the calibrated current source circuit 104 operate in conjunction with one another along with a control circuit 106 and a memory 108 to generate a precise current value while dissipating a relatively small amount of power, thereby making the current source system 100 advantageous for applications requiring precise current levels such as an IEEE 1394 physical layer device.

Although the present invention may be employed in IEEE 1394 compliant applications, it should be understood that the present invention is equally applicable to other type applications in which a low power, precise current reference is needed, and all such applications are contemplated as falling within the scope of the present invention.

According to one exemplary aspect of the present invention, the current source system 100 of FIG. 2 operates in two modes, a calibration mode and an operation mode. In the calibration mode, the control circuit 106 operates to activate the selectable high current reference circuit 102 to generate a relatively precise reference current $I_{REF}$, and activates the calibration current source circuit 104 to generate a calibrated output current ($I_{OUT(CAL)}$) based on the reference current ($I_{REF}$) via a calibration circuit 110 therein. Upon calibration being complete, a state of the calibrated current source circuit 104 which produced the desired calibrated output current $I_{OUT(CAL)}$ is saved in the memory 108 via the control circuit 106 for subsequent use. Although the current required in the selectable high current reference circuit 102 is relatively high to produce a precise reference current $I_{REF}$, since the circuit 102 is active primarily during a calibration mode and not in an operation mode, the power dissipation of the system 100 during normal operations is reduced. The calibration mode may be initiated, for example, via a calibration control signal 112, which may be activated manually, as may be desired, or in accordance with a predetermined timing or schedule.

In an operation mode, the selectable high current reference circuit 102 is inactive, and thus the modest current draw associated therewith is avoided (wherein only leakage current occurs). In addition, the control circuit 106 indicates an operation mode to the calibrated current source circuit 104 and the memory 108, wherein the calibration control data associated with a previous calibration is transmitted from the memory 108 to the control circuit 106, wherein the control circuit 106 employs such calibration data to configure the calibrated current source circuit 104 to generate the desired relatively precise output current $I_{OUT(CAL)}$.

Figure 3:
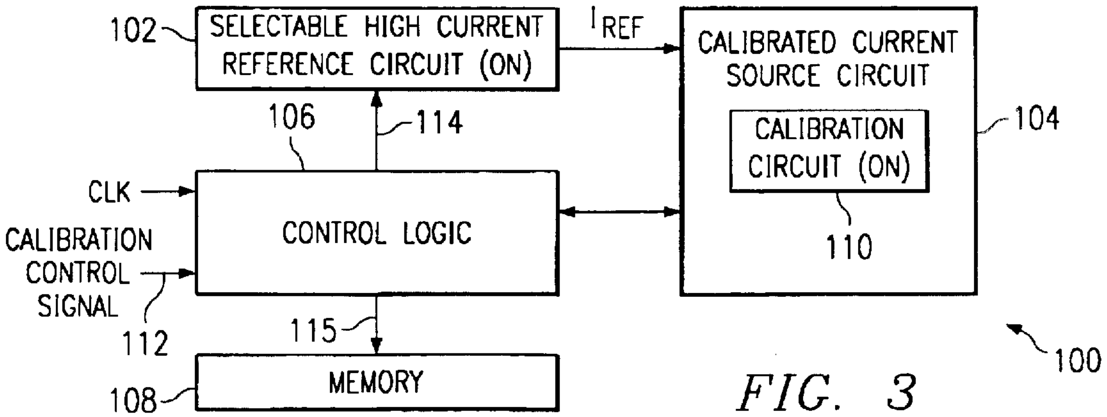
FIG. 3 is a block level schematic diagram illustrating the current reference system of FIG. 2 in a calibration mode according to another exemplary aspect of the present invention.
Figure 4:
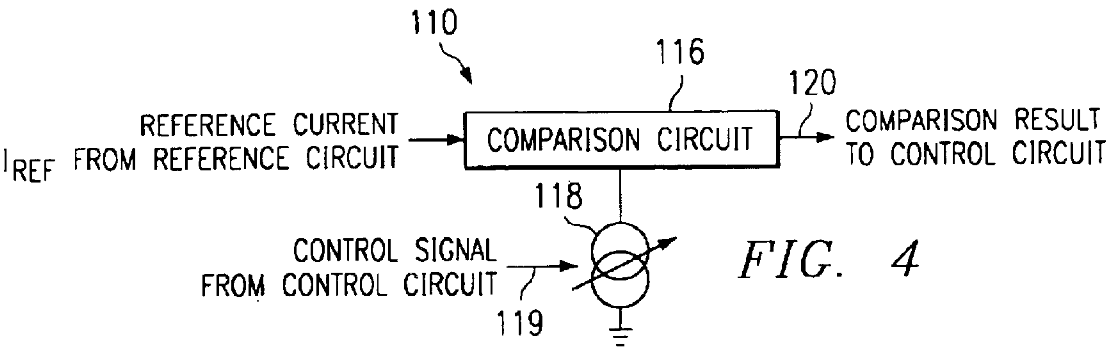
FIG. 4 is a block level schematic diagram illustrating an exemplary calibrated reference current circuit portion of the current reference system according to yet another exemplary aspect of the present invention.

Referring now to FIGS. 3 and 4, the calibration mode of the current source system 100 is illustrated and will be discussed in greater detail. According to one exemplary aspect of the present invention, the calibration mode is entered when the calibration control signal 112 is asserted, for example, by going high. In response to the asserted calibration control signal 112, the control circuit 106 activates the selectable high current reference circuit 102 via, for example, an activation signal 114. The selectable high current reference circuit 102, upon activation, then generates a relatively precise reference current $I_{REF}$ and transmits $I_{REF}$ to the calibrated reference current circuit 104, for example, as illustrated.

Upon assertion of the calibration control signal 112, the control circuit 106 also activates the calibrated reference current circuit 104, and more particularly, activates the calibration circuit 110 associated therewith. An operation of the calibration circuit 110 according to one exemplary aspect of the present invention is illustrated in FIG. 4. The calibration circuit 110 of FIG. 4 comprises a comparison circuit 116 in conjunction with a variable current source circuit 118. In the calibration mode, one or more control signals 119 (e.g., calibration control data) vary a current magnitude associated with the variable current source 118, for example, in a predetermined manner.

For each of the varying current magnitudes, the comparison circuit 116 compares the current from the variable current source 118 to the reference current $I_{REF}$ and provides a comparison result 120 in response thereto. For example, the comparison result may provide an indication when the current in the variable current source 118 is equal to, proportional to, or is otherwise related to the reference current $I_{REF}$ (e.g., according to some predetermined criteria). When such an indication is provided to the control circuit 106, the control circuit 106 identifies a state of the calibrated reference current circuit 104 at which the indication was provided (e.g., the state of the one or more control signals 119).

Referring back to FIG. 3, the identified state 115 (e.g., the control signals 119 which may be referred to as the calibration control data) is saved in the memory 108 for use in subsequent operation modes.

According to one exemplary aspect of the present invention, the calibration mode may be effectuated in a manual fashion by the assertion of the calibration control signal 112 with calibration thereof being updated each time the signal 112 is asserted. Alternatively, or additionally, such calibration may occur for various temperature conditions, with such calibration data being stored in the memory 108 for the various noted temperature conditions. Consequently, in subsequent operation modes, one of the diverse sets of calibration data may be selected based on a known or detected thermal condition, for example. This and other variations of the present invention may be employed and is contemplated as falling within the scope of the present invention.

Figure 5:
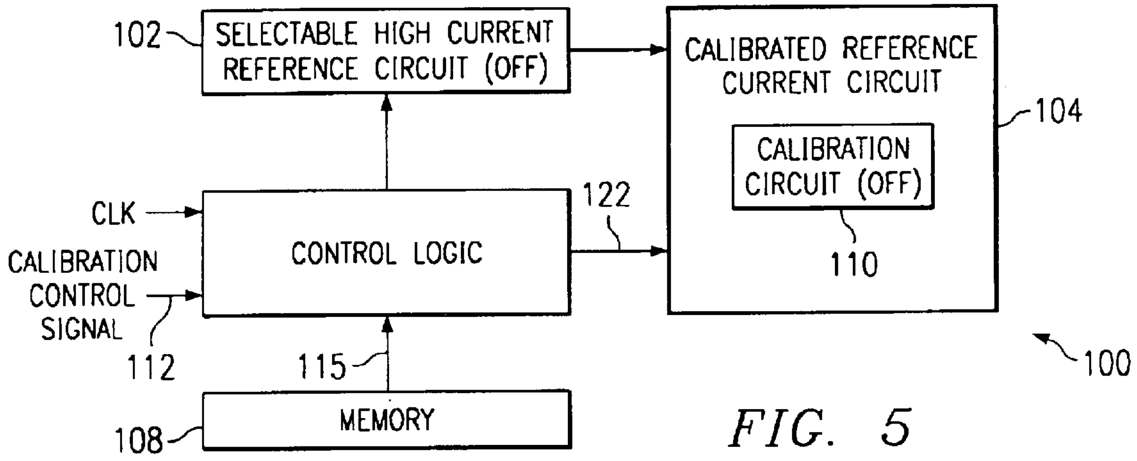
FIG. 5 is another block level schematic diagram illustrating the current reference system of FIG. 2 in an operation mode according to still another exemplary aspect of the present invention.

Turning now to FIG. 5, an operation mode of the current source system 100 according to another exemplary aspect of the present invention is disclosed. In the operation mode of the present invention, the calibration control signal 112 is not asserted, and the control circuit 106 deactivates the selectable high current reference circuit 102 and the calibration circuit portion 110 of the calibrated reference current circuit 104, thus minimizing power dissipation in the system 100. In further operation, the control circuit 106 retrieves the calibration control data 115 from the memory 108, and uses the calibration control data 115 directly or indirectly to provide one or more control signals 122 to the calibrated reference current circuit 104. The calibrated reference current circuit 104 then uses the control signal(s) 122 to provide a precise calibrated output current $I_{OUT(CAL)}$.

Figure 6:
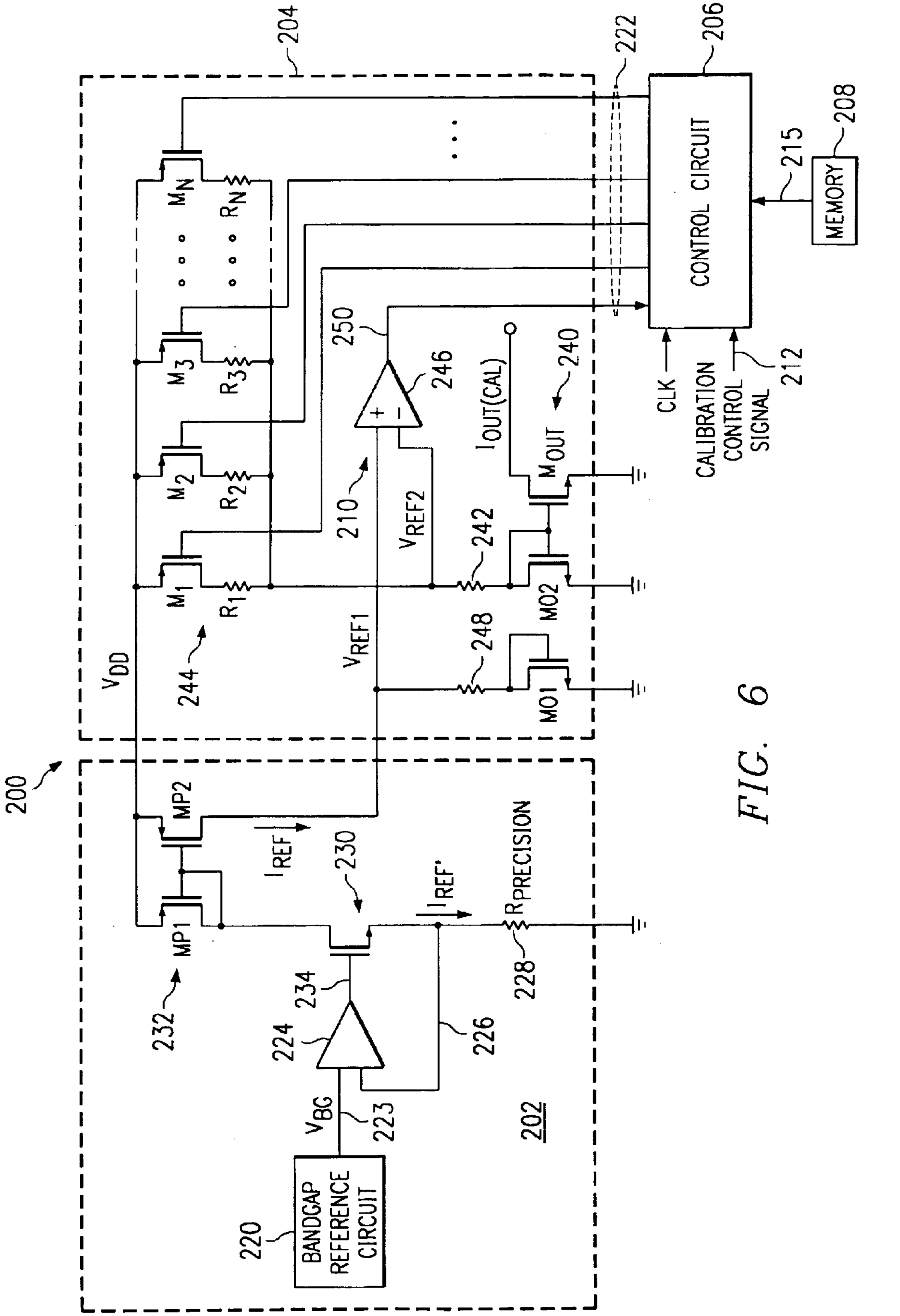
FIG. 6 is a combined block level and circuit schematic diagram illustrating in greater detail a current reference system according to yet another aspect of the present invention.

According to another exemplary aspect of the present invention, a detailed schematic diagram of a current source system is illustrated in FIG. 6, and designated at reference numeral 200. The current source system 200 comprises a selectable high current reference circuit 202 coupled to a calibrated current source circuit 204 and a control circuit 206. Also included in the system 200 is a memory 208 coupled to the control circuit 206, for example, as illustrated.

The selectable high current reference circuit 202 comprises, for example, a bandgap reference circuit 220 which is operable to generate a reference voltage 223 such as a bandgap voltage ($V_{BG}$) associated therewith. The reference voltage 223 is input to an operational amplifier 224 having a second input 226 coupled in a feedback type configuration to a recision resistor 228. The output of the op-amp 224 is coupled to a gate terminal of an NMOS transistor 230 which is coupled between the precision resistor 228 and a PMOS type current mirror circuit 232, as illustrated.

The op-amp 224 is operable to compare the voltage 226 across the precision resistor 228 to the reference voltage 223 and generate an output 234 associated therewith, such that when the reference voltage 223 exceeds the resistor voltage 226, the op-amp output 234 drives the NMOS transistor 230 harder, thereby increasing the current $I_{REF'}$ through the resistor 228 and increasing the voltage thereacross. In equilibrium, an initial reference current $I_{REF'}$ conducts through the NMOS transistor 230 and the precision resistor 228. The PMOS current mirror circuit 232 then generates or "mirrors" a current $I_{REF}$ that is related to $I_{REF'}$ based on the transistor sizing of MP1 and MP2, respectively. $I_{REF}$ is then fed to the calibrated reference current circuit 204, as illustrated.

The calibrated reference current circuit 204 comprises an NMOS current mirror circuit 240 having transistors MO2 and MOUT associated therewith, wherein MOUT provides the calibration reference current $I_{OUT(CAL)}$ based on the current through MO2. The current through MO2 is a function of two series connected resistances, a first resistance 242 and a second resistance 244 associated generally with a bank of selectively coupled resistors $R_1$–$R_N$, as illustrated. Therefore based on which one or more resistors are coupled to the first resistance 242 via switches $M_1$–$M_N$ (e.g., PMOS transistors), a current value is set through MO2, which is then "mirrored" over to MOUT based on the sizing of the transistors MO2 and MOUT, respectively.

A calibration portion 210 exists within the calibrated reference current circuit 204, for example, a NMOS transistor MO1 is coupled to an op-amp 246 through a resistance 248. The reference current $I_{REF}$ generates a reference voltage $V_{REF1}$ based on the current magnitude and the resistance 248 and voltage drop dictated by the diode-connected transistor MO1. That reference voltage $V_{REF1}$ is compared to a second reference voltage $V_{REF2}$ having a magnitude which is dictated by a resistor divider associated with the resistances 242 and 244, respectively. Accordingly, as the resistance 244 is adjusted, the magnitude of $V_{REF2}$ will also change. The op-amp 246 compares $V_{REF1}$ and $V_{REF2}$ and outputs a value 250 to the control circuit 206 based on the comparison.

According to one exemplary aspect of the present invention, in a calibration mode, the control circuit 206 (e.g., when the calibration control signal 212 is asserted) alters the resistance 244 in a predetermined fashion, for example, by turning on or off one or more of the switches M1–MN associated with the parallel bank of resistors $R_1$–$R_N$. Such action varies the value of $V_{REF2}$ in a predetermined fashion and when $V_{REF2}$ crosses $V_{REF1}$, the output 250 of the op-amp 246 switches, thus indicating, for example, a state at which $V_{REF1}$ and $V_{REF2}$ are equal. At that state, a particular current flows through MO2 which is mirrored over to MOUT, thus providing the calibrated output current $I_{OUT(CAL)}$. The state of the switches $M_1$–$M_N$ at which the output 250 of the op-amp 246 transitions is then saved by the control circuit 206 in the memory 208.

In an operation mode, the calibration control signal 212 is not asserted, and in response the control circuit 206 deactivates the selectable high current reference circuit 202 and the calibration portion 210 of the calibrated reference current circuit 204 such that only leakage current is associated therewith. The manner in which such deactivation takes place is not illustrated in FIG. 6, however, various known methods of deactivating the circuit 202 may be employed via transistor switches, for example, and any such method is contemplated as falling within the scope of the present invention.

The control circuit 206, according to one exemplary aspect of the invention, receives the calibration control data 215 (e.g., the saved calibration states discussed previously) from the memory 208 and uses the data 215 as control data 222 to determine which switches $M_1$–$M_N$ will be closed (thereby setting the value of the resistance 244). After the resistance 244 is established, a current flows through MO2 and is mirrored over to MOUT to establish $I_{OUT(CAL)}$, wherein the value thereof is related to the current through MO2 based on the sizing of the transistors MO2 and MOUT, respectively.

Figure 7:
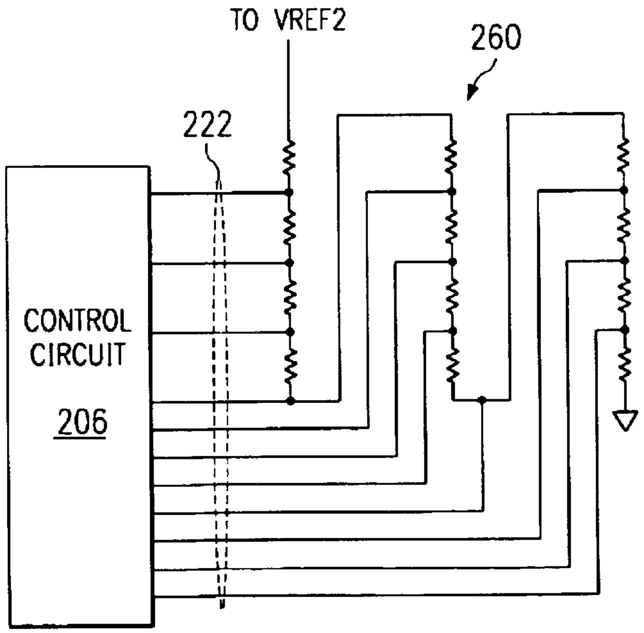
FIG. 7 is a combined block level and circuit schematic diagram illustrating a scheme for varying a voltage via an alternative form of resistor network according to another aspect of the present invention.

FIG. 6 illustrates a manner of calibrating the system 200 using a parallel bank of resistors $R_1$–$R_N$ to establish a resistance 244 associated with the calibration control data 222. Alternatively, as illustrated in FIG. 7, for example, the resistance 244 may be established via a series type network of resistances 260. In such an example, the control circuit 206 is operable to short out selective resistances (e.g., resistors) in the series chain 260 in order to establish a fine tuned resistance value via the control data 222.

In addition, although FIG. 6 illustrates the calibrated reference current circuit 204 with the resistance 244 coupled to $V_{DD}$ and the NMOS current mirror circuit 240 coupled between $V_{REF2}$ and circuit ground, the present invention may also be generated with the resistance 244 coupled to ground potential and the NMOS current mirror 240 replaced by a PMOS type current mirror coupled between $V_{REF2}$ and $V_{DD}$, as may be desired.

Figure 8:
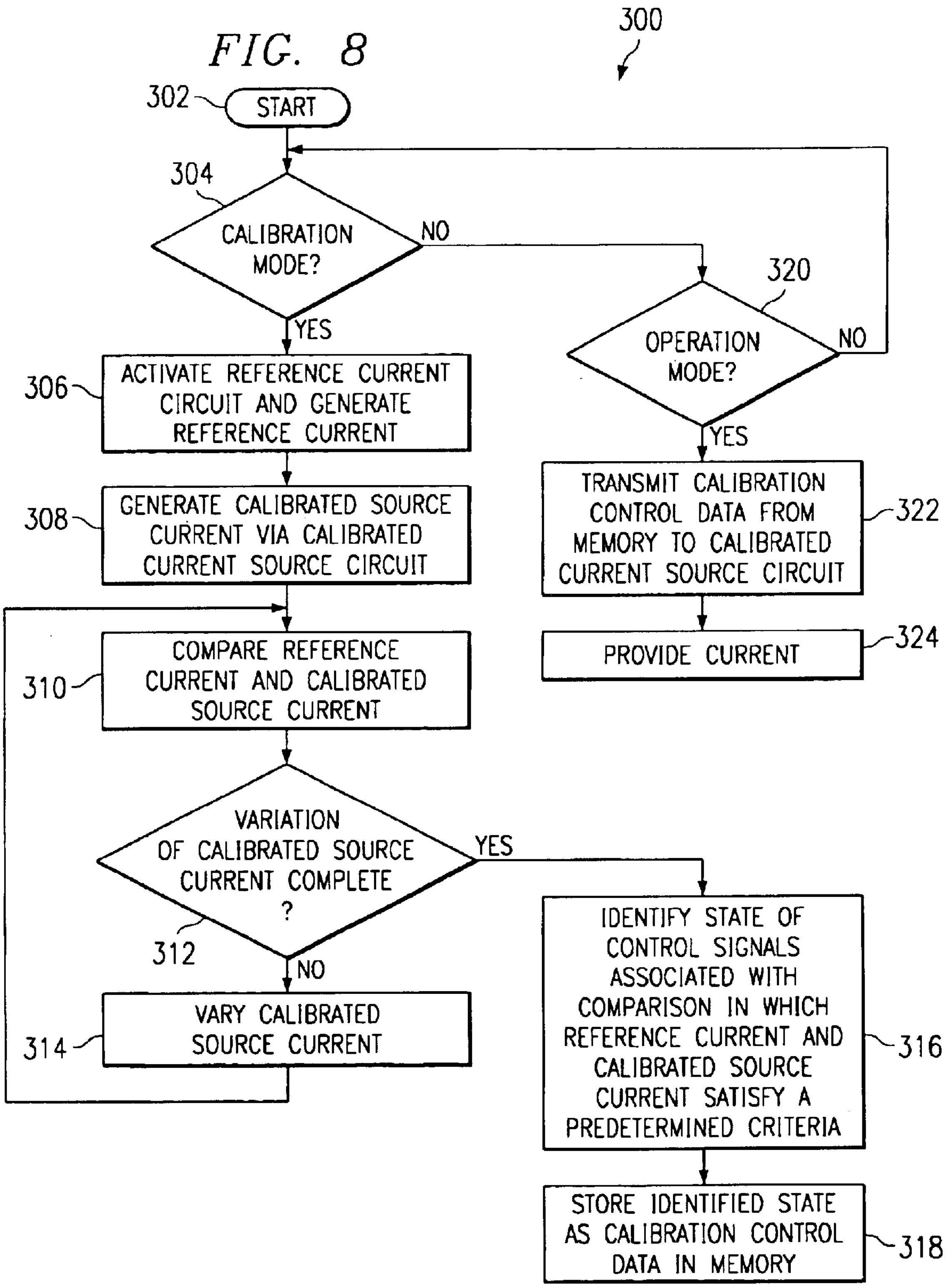
FIG. 8 is a flow chart diagram illustrating a method of generating a calibrated source current according to another aspect of the present invention.

According to yet another aspect of the present invention, a method of generating a calibrated source current is disclosed in FIG. 8 and designated at reference numeral 300. While the exemplary method 300 is illustrated and described herein as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated acts or events may be required to implement a methodology in accordance with the present invention. Moreover, it will be appreciated that the method 300 may be implemented in association with the apparatus and systems illustrated and described herein as well as in association with other systems not illustrated.

The method 300 begins at 302 and continues to 304 wherein a determination is made whether a system (e.g., the system 100) is in a calibration mode. For example, the determination at 304 may comprise determining whether a calibration signal has been asserted, however, other manners of determining may be employed and are contemplated as falling within the scope of the present invention. If the determination result at 304 is in the affirmative (e.g., YES), then a reference current circuit is activated at 306 in order to generate a relatively precise reference current. According to one exemplary aspect of the present invention, the circuitry employed to generate the reference current consumes a relatively large amount of power in order to ensure that the generated reference current is precise, however, since the calibration mode of method 300 is preferably only a short period of time, the method 300 consumes a relatively small amount of power as a whole.

The method 300 continues at 308, wherein a calibrated source current is generated, for example, using a calibrated current source circuit such as circuit 104. The reference current and the calibrated source current are then compared at 310 and such comparisons are accomplished for a variety of different calibrated source current magnitudes at 310, 312 and 314, respectively. Once a determination is made that the varying of the calibrated source current magnitude is complete at 312 (e.g., YES), a state of the control signals associated with the calibrated current source circuit when the comparison of the calibrated source current and the reference current satisfy a predetermined criteria is identified at 316. For example, 316 may comprise identifying the state of the calibrated current source generation circuit when the calibrated source current is equal to the reference current or satisfies some other predetermined relationship with the reference current (e.g., proportionality, etc.). The identified state is then stored as calibration control data in a memory at 318.

Returning to 304, if the answer to the determination is negative (e.g., NO), then an operation mode determination is made at 320. If a determination is made that no operation is to be performed, the method 300 returns to 302. Otherwise, if it is determined that an operation mode does exist (e.g., YES), the calibration control data is retrieved from the memory and transmitted to the calibrated current source circuit at 322. Once such calibration control data is received, the calibrated current generation circuit is configured and a calibrated current is provided therewith at 324.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A current reference system, comprising:

a selectively activatable high current reference circuit operable to generate a reference calibration current when activated during a calibration period, and to be substantially inactive otherwise, wherein only leakage current is associated therewith when not activated;

a low current calibrated current circuit operable to generate a reference current having a value based upon a calibration control data; and a control circuit operable to activate the selectively activatable high current reference circuit during the calibration period, and further operable to vary a characteristic of the low current calibrated current circuit in a predetermined fashion while comparing another characteristic of the low current calibrated current circuit to a predetermined value, and further operable to identify a calibration condition based on the comparison, and generate the calibration control data associated therewith.

2. The current reference system of claim 1, further comprising a memory device operable to store the control data and provide the calibration control data to the low current calibrated current circuit in response to the control circuit.

3. The current reference system of claim 1, wherein the characteristic of the low current calibrated current circuit comprises a resistance associated therewith.

4. The current reference system of claim 3, wherein the control circuit is operable to vary the resistance in a predetermined fashion, and wherein the another characteristic comprises a voltage associated with the resistance, and wherein the predetermined value is a reference voltage associated with the reference calibration current of the selectively activatable high current reference circuit, and wherein the control circuit identifies the calibration condition by identifying a resistance value at which the voltage associated therewith is approximately equal to the reference voltage.

5. A current source, comprising:

a selectively activatable current reference circuit operable to generate a calibration current when activated in a calibration mode, and is substantially inactive otherwise, wherein only leakage current is associated therewith when not activated;

a calibrated current source circuit operable to generate a calibrated source current having a value which is a function of one or more calibration control signals; and a calibration circuit operably coupled to the selectively activatable current reference circuit and the calibrated current source circuit, and configured to compare a characteristic associated with each of the selectively activatable current reference circuit and the calibrated current source circuit and generate the one or more calibration control signals in response thereto.

6. The current source of claim 5, wherein the selectively activatable current reference circuit comprises:

a bandgap reference circuit adapted to generate a bandgap reference voltage associated therewith;

a comparison circuit adapted to compare the bandgap reference voltage to a voltage across a precision resistor, and output a control signal in response thereto;

a transistor having a gate terminal coupled to the output of the comparison circuit and having a conduction terminal coupled to the precision resistor, and operable to conduct based on the control signal at the gate terminal, and wherein the conduction generates the voltage across the precision resistor; and a current mirror circuit coupled to another terminal of the transistor and operable to conduct the calibration current having a value which is related to a current through the precision resistor.

7. The current source of claim 5, wherein the calibrated current source circuit comprises a current mirror circuit having a variable resistance associated therewith, wherein the current mirror circuit is adapted to generate the calibrated source current having a magnitude which is a function of the variable resistance, and wherein the variable resistance is dictated by the one or more control signals.

8. The current source of claim 5, wherein the calibration circuit comprises:

a comparison circuit having a first input coupled to the selectively activatable current reference circuit and a second input coupled to the calibrated source current circuit, and wherein the characteristics comprise a voltage associated with the calibration current and the calibrated source current, respectively, and wherein the comparison circuit is operable to generate an output signal in response to a comparison of the voltages at the first and second inputs; and a control circuit coupled to the output of the comparison circuit and the calibrated current source circuit, wherein the control circuit is adapted to vary the calibrated source current and generate one or more calibration control signals based on the output signal as the calibrated source current is varied.

9. The current source of claim 8, wherein the control circuit is adapted to vary the calibrated source current by varying a resistance associated with the calibrated current source circuit using the one or more calibration control signals.

10. The current source of claim 9, wherein the calibrated current source circuit comprises a current mirror circuit comprising:

a first NMOS transistor having a gate terminal coupled to a drain terminal and a source terminal coupled to a predetermined potential;

a resistor network comprising a plurality of resistors, wherein each of the resistor is coupled in series to a switching device, respectively, thereby forming a plurality of resistance components, wherein each of the resistance components are coupled together in parallel, and wherein one terminal of the resistor network is coupled to a supply potential and another terminal of the resistor network is coupled to the drain of the first NMOS transistor via a base resistor; and a second NMOS transistor having a gate terminal coupled to the gate terminal of the first NMOS transistor, a source terminal coupled to the predetermined potential, and a drain terminal forming an output of the calibrated current source circuit, wherein the switching devices in the resistor network are controlled by the one or more calibration control signals, thereby dictating a resistance associated with the resistor network and a current associated with the current mirror circuit.

11. The current source of claim 10, wherein the control circuit is further adapted in a calibration mode to alter the resistance associated with the resistor network in a predetermined fashion via the one or more calibration control signals, and further adapted to monitor the output of the comparison circuit for each of the varied resistances, and wherein the control circuit is further adapted to identify a state of the one or more calibration control signals and thus the resistance value of the resistor network when the output of the comparison circuit switches states.

12. The current source of claim 11, wherein the control circuit is further operable to store the state of the one or more calibration control signals in a memory as control data for use by the calibrated current source circuit in an operation mode.

13. A low power dissipation current source, comprising:

a selectively activatable reference current source circuit configured to generate a generally high precision reference current in a calibration mode, and inactive otherwise, whereby only leakage current is associated therewith when inactive;

a calibrated current source circuit operable to be calibrated in the calibration mode by varying a current associated therewith according to one or more calibration control signals, and further operable to conduct a calibrated current in an operation mode;

a selectively activatable calibration control circuit adapted to generate and vary a state of the one or more calibration control signals to vary the current associated with the calibrated current source circuit, and compare the varied current with the generally high precision reference current in the calibration mode for the varied calibration control signal states, and further adapted to identify a state of the one or more calibration control signals at which the calibrated source current has a value which is related to the generally high precision reference current in a predetermined fashion, and further operable to transmit the identified state of the one or more calibration control signals to a memory, and wherein the selectively activatable calibration control circuit is active in the calibration mode and inactive otherwise, whereby only leakage current is associated therewith when inactive; and the memory device configured to store the identified state of the one or more calibration control signals, and operable to provide the identified state of the one or more calibration control signals to the calibrated current source circuit in the operation mode.

14. A method of generating a calibrated source current, comprising:

generating a reference current in a calibration mode by activating a high current reference circuit;

generating a calibrated source current in the calibration mode using one or more calibration control signals, wherein the calibrated source current has a value that varies over a predetermined range;

comparing the reference current and the calibrated source current as the value of the calibrated source current is varied;

identifying a state of the one or more calibration control signals at which a predetermined relationship between the reference current and the calibrated source current exists in the calibration mode;

storing the identified state of the one or more calibration control signals in a memory;

deactivating the high current reference circuit in a low current operation mode; and retrieving the identified state of the one or more calibration control signals from the memory for use in generating the calibrated source current in the low current operation mode.

15. The method of claim 14, wherein generating the reference current comprises:

generating a bandgap reference voltage;

comparing the bandgap reference voltage to a voltage across a precision resistor, wherein the voltage across the precision resistor is a function of the reference current; and adjusting a magnitude of the reference current in response to the comparison.

16. The method of claim 14, wherein generating the calibrated source current comprises:

generating a calibration current which is a function of a resistance;

generating the calibrated source current based on the calibration current; and varying a value of the resistance, thereby varying the calibration current, wherein the value of the resistance is a function of the one or more calibration control signals.

17. The method of claim 16, wherein comparing the reference current and the calibrated source current comprises comparing the reference current to the calibration current, wherein the calibration current is related to the calibrated source current.

* * * * *